United States Patent
Hara et al.

(10) Patent No.: US 9,294,052 B2
(45) Date of Patent: Mar. 22, 2016

(54) PERSONAL COMPUTER TO OUTPUT AUDIO IN A NON-OPERATIVE STATE

(71) Applicant: KABUSHIKI KAISHA TOSHIBA, Minato-ku, Tokyo (JP)

(72) Inventors: Terunobu Hara, Ome (JP); Hiroaki Yokomichi, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 229 days.

(21) Appl. No.: 14/071,402

(22) Filed: Nov. 4, 2013

(65) Prior Publication Data

US 2014/0050337 A1 Feb. 20, 2014

Related U.S. Application Data

(63) Continuation of application No. 12/955,518, filed on Nov. 29, 2010, now abandoned.

(30) Foreign Application Priority Data

Nov. 30, 2009 (JP) .................................. 2009-272691

(51) Int. Cl.
- H03F 99/00 (2009.01)
- H03F 3/181 (2006.01)
- G06F 1/26 (2006.01)

(52) U.S. Cl.
CPC ................ *H03F 3/181* (2013.01); *G06F 1/266* (2013.01)

(58) Field of Classification Search
CPC ... G06F 1/3234; G06F 1/3203; G06F 1/3287; H03F 2200/03; H03F 3/68
USPC .................................................. 381/120, 28
See application file for complete search history.

(56) References Cited

U.S. PATENT DOCUMENTS

| 5,311,441 A | 5/1994 | Tayama et al. |
| 5,740,453 A | 4/1998 | Lada |
| 5,822,598 A | 10/1998 | Lam |
| 6,128,263 A | 10/2000 | Fujii et al. |

(Continued)

FOREIGN PATENT DOCUMENTS

| JP | 02-260900 A | 10/1990 |
| JP | 07-239737 A | 9/1995 |

(Continued)

OTHER PUBLICATIONS

Notice of Reasons for Rejection mailed by the Japan Patent Office on Apr. 26, 2011 in corresponding Japanese patent app. No. 2009-272691 in 8 pages.

(Continued)

*Primary Examiner* — Alexander Jamal
(74) *Attorney, Agent, or Firm* — Knobbe, Martens, Olson & Bear LLP

(57) ABSTRACT

According to one embodiment, an electronic apparatus includes a terminal, an amplifier, a speaker, a power supply circuit and a first controller. The terminal configured to input an audio signal from an external device. The amplifier configured to amplify the audio signal. The speaker configured to output sound corresponding to the audio signal which is amplified by the amplifier. The power supply circuit configured to supply power to the amplifier. The first controller configured to control the power supply circuit to continue the supply of the power, when the electronic apparatus is in a non-operative state.

7 Claims, 4 Drawing Sheets

(56) References Cited

U.S. PATENT DOCUMENTS

| | | |
|---|---|---|
| 6,437,699 B1 | 8/2002 | Hayakawa |
| 6,523,125 B1 | 2/2003 | Kohno et al. |
| 6,564,330 B1 | 5/2003 | Martinez et al. |
| 6,629,182 B1 | 9/2003 | Mizoguchi et al. |
| 6,772,024 B2 | 8/2004 | Fujii |
| 7,076,646 B2 | 7/2006 | Chang |
| 7,130,930 B1* | 10/2006 | Chan et al. ............... 710/14 |
| 7,409,064 B2 | 8/2008 | Watanuki |
| 7,673,156 B1 | 3/2010 | Nojima |
| 7,818,443 B2 | 10/2010 | Du et al. |
| 7,945,796 B2 | 5/2011 | Fijiwara |
| 8,024,055 B1 | 9/2011 | Holmgren et al. |
| 8,084,987 B2 | 12/2011 | Hurtz |
| 8,117,475 B2 | 2/2012 | Pesavento et al. |
| 8,171,322 B2 | 5/2012 | Fiennes et al. |
| 8,230,243 B2 | 7/2012 | Fujiwara |
| 8,411,870 B2 | 4/2013 | Shimoharada |
| 2001/0022842 A1 | 9/2001 | Fujii |
| 2003/0086683 A1 | 5/2003 | Morisawa |
| 2005/0086614 A1 | 4/2005 | Cheng et al. |
| 2005/0100178 A1* | 5/2005 | Rybicki et al. ............... 381/101 |
| 2007/0064955 A1 | 3/2007 | Saito |
| 2008/0192942 A1 | 8/2008 | Yamkovoy et al. |
| 2008/0303947 A1 | 12/2008 | Ohnishi et al. |
| 2009/0006874 A1 | 1/2009 | Fujiwara |
| 2009/0060226 A1 | 3/2009 | Chen et al. |
| 2011/0129104 A1 | 6/2011 | Saito |
| 2011/0158436 A1 | 6/2011 | Imamura |
| 2011/0158441 A1 | 6/2011 | Batra |
| 2012/0237059 A1 | 9/2012 | Saito |
| 2014/0050337 A1 | 2/2014 | Hara et al. |

FOREIGN PATENT DOCUMENTS

| | | |
|---|---|---|
| JP | 09-101848 A | 4/1997 |
| JP | 10-340517 A | 12/1998 |
| JP | 11-053072 A | 2/1999 |
| JP | 11-086433 A | 3/1999 |
| JP | 11-167439 A | 6/1999 |
| JP | 11-175205 A | 7/1999 |
| JP | 11-194846 A | 7/1999 |
| JP | 11-202965 A | 7/1999 |
| JP | 2000-039935 A | 2/2000 |
| JP | 2000-305672 A | 11/2000 |
| JP | 2001-197599 A | 7/2001 |
| JP | 2001-216132 A | 8/2001 |
| JP | 2002-101491 A | 4/2002 |
| JP | 2002-142161 A | 5/2002 |
| JP | 2003-140879 A | 5/2003 |
| JP | 2003-309892 A | 10/2003 |
| JP | 2005-115550 A | 4/2005 |
| JP | 2005-128994 A | 5/2005 |
| JP | 2006-525598 A | 11/2006 |
| JP | 2007-108769 A | 4/2007 |
| JP | 2007-166557 A | 6/2007 |
| JP | 2007-206896 A | 8/2007 |
| JP | 2008-258730 A | 10/2008 |
| JP | 2009-009532 A | 1/2009 |
| WO | WO 2004/088494 A1 | 10/2004 |

OTHER PUBLICATIONS

Notice of Reasons for Rejection mailed by the Japan Patent Office on Aug. 9, 2011 in corresponding Japanese patent app. No. 2009-272691 in 9 pages.

Notice of Reasons for Rejection mailed by Japan Patent Office on Mar. 8, 2011 in the corresponding Japanese patent application No. 2009-272775.

Japanese Office Action for corresponding Japanese Application No. 2011-137725, mailed Aug. 21, 2012, in 5 pages.

Microsoft How to Disable the Feature That Allows CD-ROMs and Audio CDs to Run Automatically Microsoft, Oct. 26, 2007, Web. Nov. 8, 2012 <http://support.micorsoft.com/kb/126025/EN-US>.

U.S. Appl. No. 13/485,564, filed May 31, 2012, Saito.

U.S. Appl. No. 13/016,909, filed Jan. 28, 2011, Shimoharada.

U.S. Appl. No. 12/955,660, filed Nov. 29, 2010, Saito.

U.S. Appl. No. 11/472,994, filed Jun. 23, 2006, Saito.

* cited by examiner

| Audio output mode | Plug insertion | Power supply to amplifier |
|---|---|---|
| Permitted | Inserted | On |
| | Not inserted | Off |
| Prohibited | | Off |

PERSONAL COMPUTER TO OUTPUT AUDIO IN A NON-OPERATIVE STATE

CROSS-REFERENCE TO RELATED APPLICATIONS

This application is a continuation of U.S. patent application Ser. No. 12/955,518 filed on Nov. 29, 2010, which is based upon and claims the benefit of priority from Japanese Patent Application No. 2009-272691, filed Nov. 30, 2009; the entire contents of each of which are incorporated herein by reference.

FIELD

Embodiments described herein relate generally to an electronic apparatus having a speaker.

BACKGROUND

Conventionally, there is known a technique for causing a small-sized information processing apparatus (personal computer) to function as a music playback apparatus (CD (Compact Disc) player).

In a small-sized information processing apparatus disclosed in Jpn. Pat. Appln. KOKAI Publication No. H09-101848, a mode switch is provided for causing the small-sized information processing apparatus to function as a music playback apparatus, and a process for CD playback is executed when power is turned on by the operation of this mode switch. In the process for CD playback, when power is turned on, diagnosis and initial settings are executed for an IDE controller to which a CD-ROM drive is connected, a bus bridge to which the IDE controller is connected, and an interrupt controller which mediates to deliver an interrupt signal of the IDE controller to the processor. In addition, a device driver for playing back a music CD, which is stored in the CD-ROM drive, is initialized. Further, power-saving is achieved by supplying power to only necessary components mainly including the IDE controller, bus bridge, interrupt controller, amplifier, CD-ROM drive and main memory, and stopping power supply to unnecessary components such as a fan and a hard disk drive.

As has been described above, in the prior art, in order to cause the small-sized information processing apparatus to function as the music playback apparatus, it is necessary to turn on power by operating the dedicated mode switch, and to execute the diagnosis and initial settings for the modules necessary for the CD playback, in the same manner as at the time of normal start-up. In addition, it is necessary to execute the program (device driver) for controlling CD playback.

Specifically, in the prior art, although the modules that are operated are limited to only some modules necessary for CD playback, these modules need to be set in the operative state through the process at the time of normal power-on. In addition, since the audio output is controlled by the program for controlling CD playback, power supply to the CPU and main memory, which are principal components of the small-sized information processing apparatus, cannot be cut off.

BRIEF DESCRIPTION OF THE DRAWINGS

A general architecture that implements various features of the embodiments will now be described with reference to the drawings. The drawings and the associated descriptions are provided to illustrate the embodiments and not to limit the scope of the invention.

DETAILED DESCRIPTION

Various embodiments will be described hereinafter with reference to the accompanying drawings.

In general, according to one embodiment, an electronic apparatus includes a terminal, an amplifier, a speaker, a power supply circuit and a first controller. The terminal configured to input an audio signal from an external device. The amplifier configured to amplify the audio signal. The speaker configured to output sound corresponding to the audio signal which is amplified by the amplifier. The power supply circuit configured to supply power to the amplifier. The first controller configured to control the power supply circuit to continue the supply of the power, when the electronic apparatus is in a non-operative state.

An embodiment will now be described with reference to the accompanying drawings.

Figure 1:
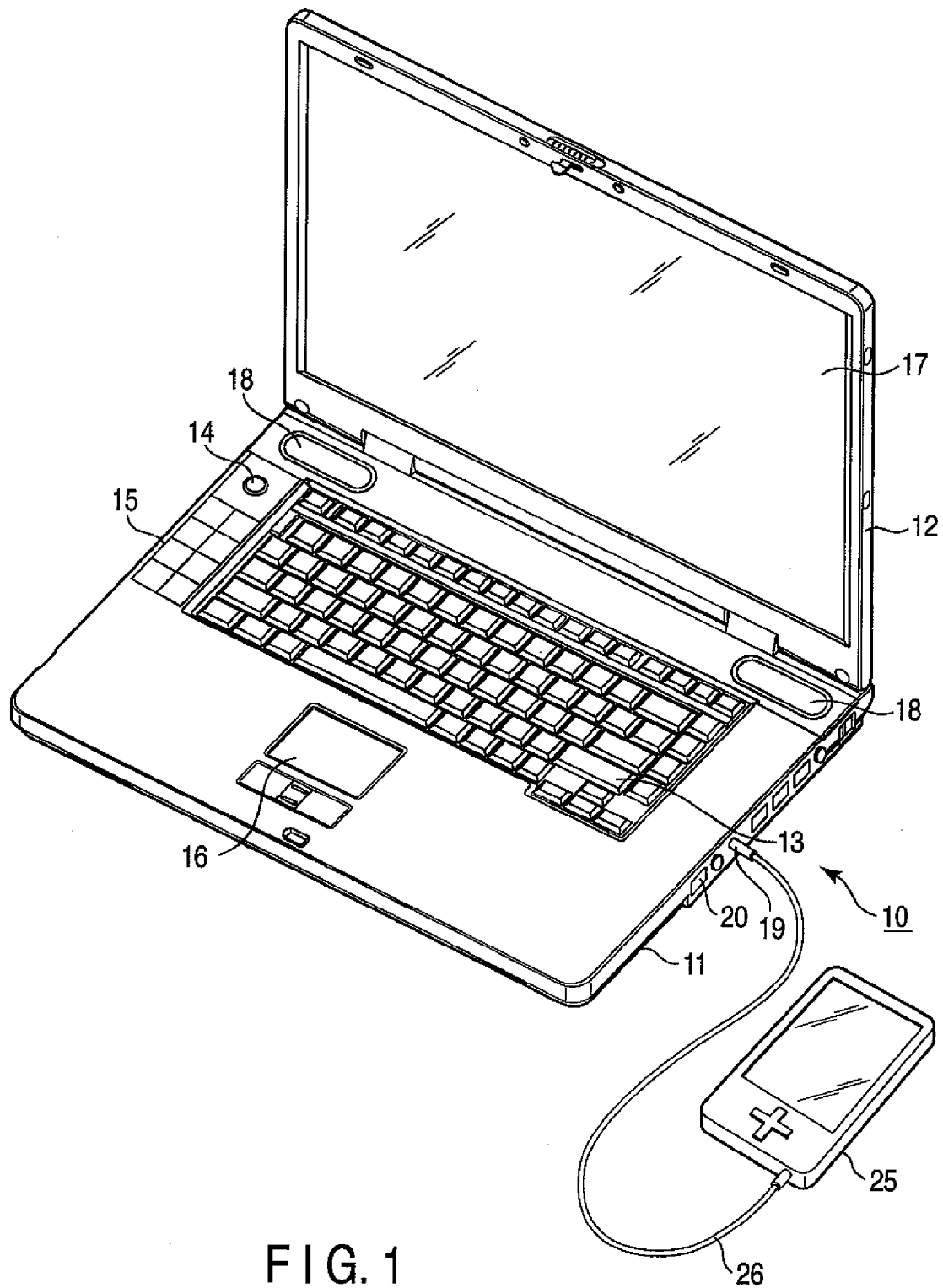
FIG. 1 shows the external appearance of the structure of an electric apparatus according to an embodiment.

FIG. 1 shows the external appearance of the structure of an electronic apparatus according to the present embodiment. The electronic apparatus is realized, for example, as a notebook-type portable personal computer 10. The personal computer 10 of this embodiment has an audio output function (sleep & music function) for receiving, in a non-operative state, an analog audio signal which is output from a line output-equipped external device (e.g. a portable audio player 25), and outputting the audio signal from speakers 18 which are mounted on the housing of the computer 10.

In the case where the output from the audio player 25 is directly connected to the speakers, since the output of the audio player 25 is small, compared to the capability of the speakers, the speakers are unable to output sound of a sufficient volume. According to the audio output function that is provided in the personal computer 10 in this embodiment, even in the case where the personal computer 10 is in the non-operative state, power is supplied to a built-in amplifier for audio signal amplification, thus being able to amplify the audio signal from the audio player 25 and output the amplified audio signal from the speakers.

It is assumed that the "non-operative state" of the personal computer 10 includes states called "standby/sleep/suspend" and "hibernation" (hibernate state), as well as a power-off state. In short, the non-operative state is a state in which the processor (CPU 30) does not operate.

FIG. 1 is a perspective view showing the state in which a display unit of the personal computer 10 is opened. The personal computer 10 comprises a computer main body 11 and a display unit 12. A display device, which is composed of an LCD (Liquid Crystal Display) 17, is built in the display unit 12. The display screen of the LCD 17 is disposed at a substantially central part of the display unit 12.

The display unit 12 is attached to the computer main body 11 such that the display unit 12 is rotatable between an open position and a closed position, relative to the computer main body 11. The computer main body 11 has a thin box-shaped housing, to which a battery is detachably attached.

A keyboard 13, a power button switch 14 for power-on/power-off, general-purpose hardware buttons 15, a touch pad 16, and speakers 18 are disposed on the top surface of the computer main body 11.

A side surface of the computer main body 11 is provided with a line-in terminal 19 (jack) for receiving an analog audio signal which is output from the audio player 25, and a volume dial 20 which is used for volume control in the case where the audio output function is enabled at the time of the non-operative state. A cable 26, which is connected to a line-out terminal of the audio player 25, can be connected to the line-in terminal 19.

Figure 2:
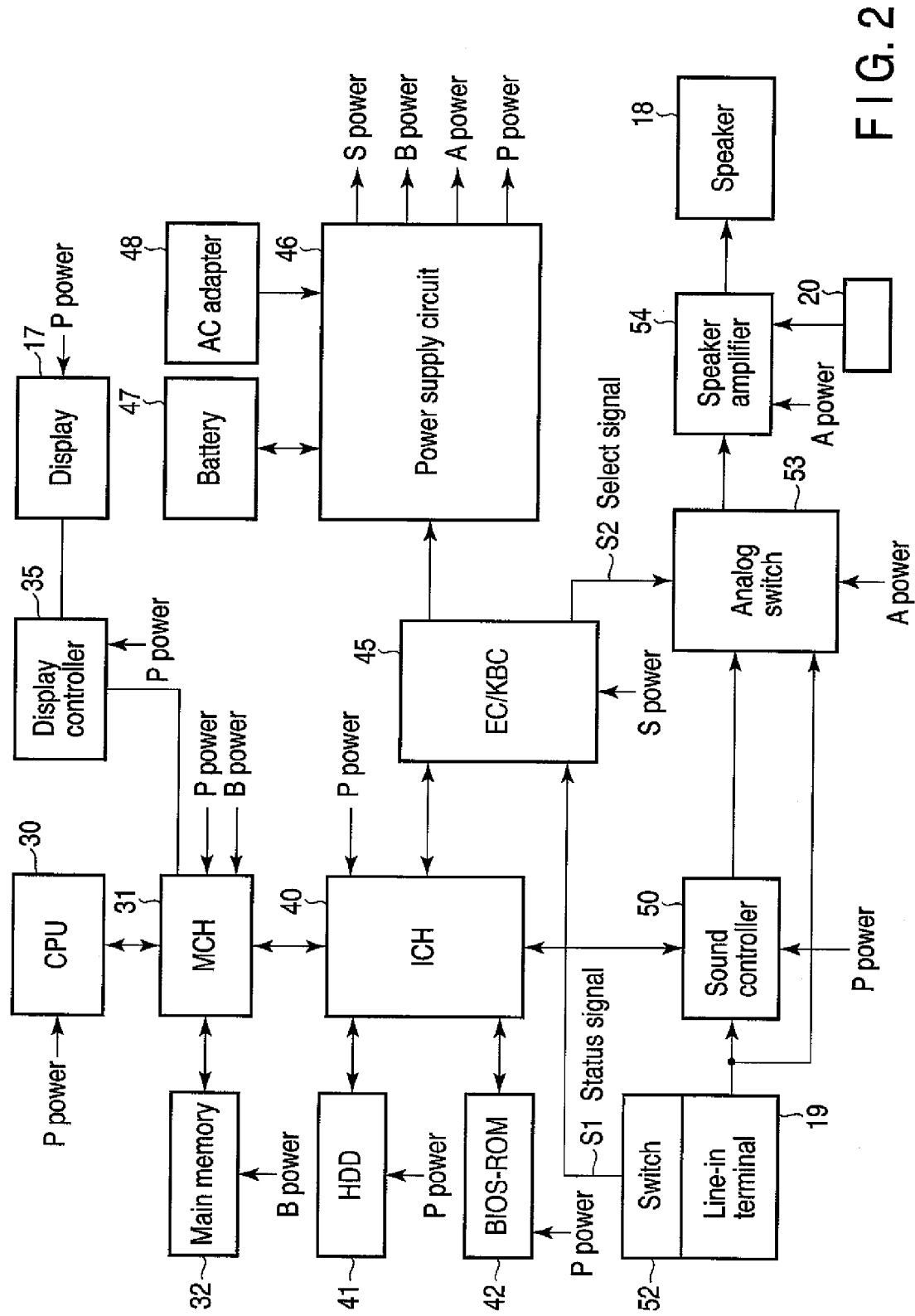
FIG. 2 is an exemplary block diagram showing the system configuration of a personal computer according to the embodiment.

Next, referring to FIG. 2, a description is given of the system configuration of the personal computer 10 according to the embodiment.

The personal computer 10, as shown in FIG. 2, includes a CPU 30, an MCH 31 (north bridge), a main memory 32, a display controller 35, an ICH 40 (south bridge), a hard disk drive (HDD) 41, a BIOS-ROM 42, an embedded controller/keyboard controller IC (EC/KBC) 45, and a power supply circuit 46.

The CPU 30 is a processor which is provided in order to control the operation of the personal computer 10, and executes an operating system (OS), drivers for controlling various hardware, and various application programs, which are loaded from the HDD 41 into the main memory 32. The CPU 30 also executes a system BIOS (Basic Input/Output System) which is stored in the BIOS-ROM 42. The system BIOS is a program for hardware control. In this embodiment, it is assumed that an audio output mode select process, which will be described later, can be executed in BIOS setup. In addition, the audio output mode select process can be executed by a utility program which executes hardware setup.

The MCH 31 is a bridge device which connects a local bus of the CPU 30 and the ICH 40. The MCH 31 incorporates a memory controller for access-controlling the main memory 32.

The display controller 35 controls the LCD 17 which is used as a display monitor of the personal computer 10. On the basis of an image-rendering request which is sent from the CPU 30 via the MCH 31, the display controller 35 executes a display process (graphics arithmetic process) for rendering frames in a video memory (VRAM).

The ICH 40 incorporates an IDE (Integrated Drive Electronics) controller and a Serial ATA controller for controlling the HDD 41 and an optical disc drive (not shown).

The embedded controller/keyboard controller IC (EC/KBC) 45 is a 1-chip microcomputer in which an embedded controller for power management and a keyboard controller for controlling the keyboard (KB) 13, touch pad 15 and general-purpose hardware buttons 18 are integrated.

The EC/KBC 45 has a function of controlling the power supply circuit 46 in accordance with an operation of the power button switch 14 by a user, and powering on/off the personal computer 10. The power-on/off control of the personal computer 10 is executed by the cooperation between the EC/KBC 45 and power supply circuit 46. In addition, the EC/KBC 45 controls the audio output function which is used when the personal computer 10 is in the non-operative state.

The power supply circuit 46 receives power from a battery 47 which is attached to the computer main body 11 or from an external power supply which is connected via an AC adapter 48, and generates and supplies operation power to the respective components. The power supply circuit 46 is provided with a power supply microcomputer. The power supply microcomputer monitors the power supply (charge/discharge) relating to the respective components and the battery, and the charging state of the battery.

The power supply circuit 46 switches the power supply to the respective modules by the control of the EC/KBC 45, in accordance with the system state of the personal computer 10. By the control of the EC/KBC 45, the power supply circuit 46 can turn on/off the power supply of an S power, a B power, an A power and a P power. In the case where the personal computer 10 is in the power-on state, the power supply circuit 46 turns on power supply of all of the S power, B power, P power and A power. In the case where the personal computer 10 is in the standby/sleep/suspend state, the power supply of the S power and B power is turned on. In the case where the personal computer 10 is in the hibernation (hibernate state) or in the power-off state, the supply of the S power is turned on. In the case where the power supply in the non-operative state is set to be permitted by the EC/KBC 45, the power supply circuit 46 turns on the supply of the A power at the time of the non-operative state, thereby supplying power to the speaker amplifier 54 and analog switch 53. Since the S power is supplied to the EC/KBC 45, the power supply is turned on in any one of the system states and the control of the audio output function at the non-operation time is enabled.

The sound controller 50 converts digital audio data, which is input via the ICH 40, to an analog audio signal, and outputs the analog audio signal to the analog switch 53 by executing volume control by the control of the OS, device driver, audio playback program, etc. Similarly, when the personal computer 10 is in the operative state, the sound controller 50 executes volume control of an analog audio signal from the audio player 25, which is input via the line-in terminal 19, and outputs the resultant analog audio signal to the analog switch 53.

The analog switch 53 switches the path between the sound controller 50 side and the line-in terminal 19 side, in accordance with a select signal S2 from the EC/KBC 45. The analog switch 53 is changed over to the sound controller 50 side when the personal computer 10 is in the operative state. In the case where the audio output function is enabled at the non-operation time, the analog switch 53 is changed over to the line-in terminal 19 side, with the sound controller 50 being bypassed.

The speaker amplifier 54 amplifies the analog audio signal which is input via the analog switch 53, and outputs sound corresponding to the audio signal from the speaker 18. In addition, in the case where the audio output function is enabled, the speaker amplifier 54 executes volume control for the audio signal, in accordance with the operation of the volume dial 20.

The line-in terminal 19 is provided with a switch 52. The switch 52 outputs to the EC/KBC 45 a status signal S1 corresponding to the insertion/non-insertion of a plug for connecting the cable 26 to the line-in terminal 19.

Next, the operation of the personal computer 10 according to the present embodiment is described.

Figure 3:
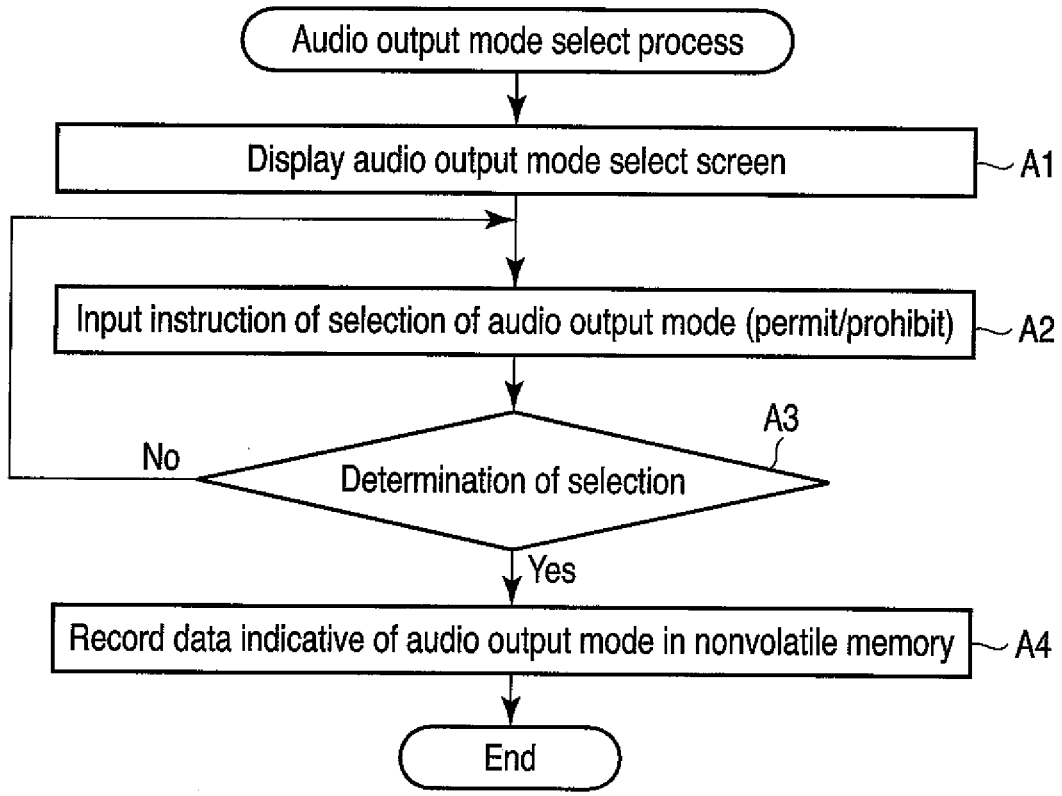
FIG. 3 is an exemplary flow chart illustrating an audio output mode select process in the embodiment.

FIG. 3 is a flow chart illustrating an audio output mode select process in the present embodiment. The audio output mode select process is a process for executing, according to an instruction by the user, a selection as to whether audio output by the audio output function is to be permitted or prohibited.

The audio output mode select process in this embodiment can be executed, for example, in the process of BIOS setup or hardware setup. For example, the BIOS setup can be executed by starting the BIOS setup by performing a predetermined key operation at a time of power-on. The hardware setup can be executed by starting a utility program for hardware setup. In the present embodiment, the audio output mode select process may be executed by either method.

If the execution of the audio output mode select process is instructed, the CPU 30 causes the LCD 17 to display an audio output mode select screen (block A1).

Figure 4:
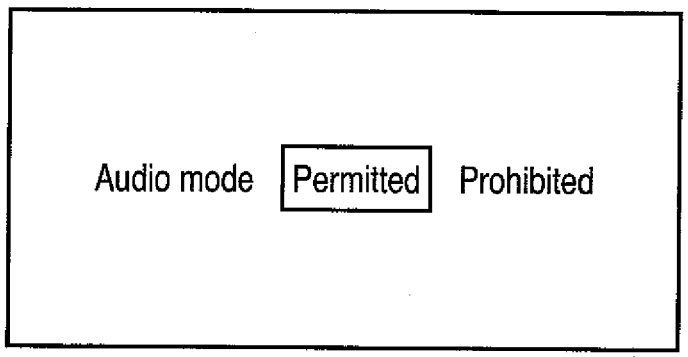
FIG. 4 is an exemplary view showing an audio output mode select screen in the embodiment.

FIG. 4 shows an example of the audio output mode select screen. On the audio output mode select screen, the audio output mode can be designated to be either "permitted" or "prohibited".

In the CPU 30, for example, by the operation of the keyboard 13 by the user, an instruction to select either "Permitted" or "Prohibited" is input (block A2). If determination of selection is instructed (Yes in block A3), the CPU 30 records data indicative of the audio output mode, that is, data indicative of either "Permitted" or "Prohibited", in a nonvolatile memory (block A4).

As the nonvolatile memory which stores data indicative of the audio output mode, use may be made of the BIOS-ROM 42 or a memory in the EC/KBC 45. In short, it should suffice if the data can be read in a power-off process which will be described below.

Figures 5, 6:
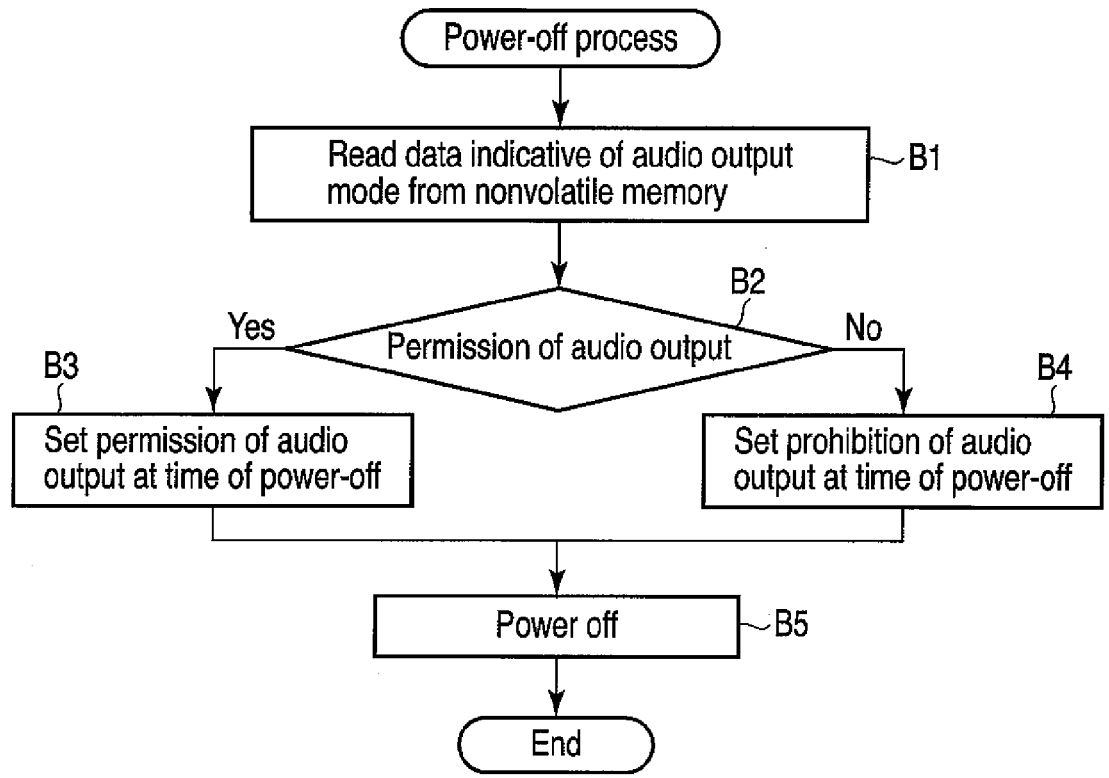
FIG. 5 is an exemplary flow chart illustrating a power-off process in the embodiment.
FIG. 6 is an exemplary view showing an example of control of power supply according to the combination between an audio output mode and plug insertion in a line-in terminal in the embodiment.

FIG. 5 is a flow chart illustrating the power-off process in the present embodiment.

The CPU 30 starts the power-off process in the case where power-off is requested according to an instruction from the user or a request from the program. The "power-off", in this context, means that the personal computer 10 is set in the non-operative state, and thus the "power-off" means not only the complete power-off state, but also the states called "standby/sleep/suspend" and "hibernation" (hibernate state).

The CPU 30 reads from the nonvolatile memory (e.g. BIOS-ROM 42) the data indicative of the audio output mode by the audio output mode select process (block B1).

In the case where the data indicative of the audio output mode indicates "prohibition" of audio output (No in block B2), the CPU 30 sets the EC/KBC 45 to prohibit audio output at the time of the non-operative state. In this case, the EC/KBC 45 sets the power supply circuit 46 to prohibit power supply to the speaker amplifier 54 at the time of the non-operative state (block B4). Specifically, the power supply circuit 46 turns off the supply of the A power to the speaker amplifier 54 and analog switch 53.

On the other hand, in the case where the data indicative of the audio output mode indicates "permission" of audio output (Yes in block B2), the CPU 30 sets the EC/KBC 45 to permit audio output at the time of the non-operative state. In this case, the EC/KBC 45 sets the power supply circuit 46 to permit power supply to the speaker amplifier 54 at the time of the non-operative state (block B3). Specifically, the power supply circuit 46 turns on the supply of the A power to the speaker amplifier 54 and analog switch 53. In addition, the EC/KBC 45 outputs the select signal S2 to the analog switch 53 so as to change the path over to the line-in terminal 19 side.

Thereafter, the personal computer 10 is powered off (non-operative state) (block B5).

If the personal computer 10 is set in the non-operative state, the power supply circuit 46 performs power supply in accordance with the setting by the EC/KBC 45. Specifically, in the case where the power supply to the speaker amplifier 54 is prohibited at the time of the non-operative state, the power supply circuit 46 turns off not only the supply of the B power and P power, but also the supply of the A power to the speaker amplifier 54, at the time of the hibernation (hibernate state) and the power-off state. In the case of the non-operative state of standby/sleep/suspend, the power supply circuit 46 turns on the supply of the B power for backing up the main memory 32.

On the other hand, in the case where the power supply to the speaker amplifier 54 is permitted at the time of the non-operative state, the power supply circuit 46 turns off the supply of the B power and P power, but turns on the supply of the A power to the speaker amplifier 54, at the time of the hibernation (hibernate state) and the power-off state. In the case of the non-operative state of standby/sleep/suspend, the power supply circuit 46 turns on the supply of the B power for backing up the main memory 32.

By executing power-off by setting the audio output mode to be "permitted", the power supply to the speaker amplifier 54 is continued even in the non-operative state, and thus the audio output function is enabled. At this time, if the plug of the cable 26 for connection of the audio player 25 is connected to the line-in terminal 19, an analog audio signal which is output from the audio player 25 is input to the line-in terminal 19, and this signal is input to the speaker amplifier 54 via the analog switch 53, with the sound controller 50 being bypassed. The speaker amplifier 54 amplifies the audio signal and produces sound from the speakers 18. In the non-operative state, since the sound controller 50 does not operate, the volume control is performed by the volume dial 20. The speaker amplifier 54 amplifies the audio signal in accordance with the operation amount of the volume dial 20.

As has been described above, in the personal computer 10 of the present embodiment, the audio output mode select process is executed prior to the power-off process, and the audio output mode may be set to be "permitted". Thereby, even at the time of the non-operative state, the power supply to the speaker amplifier 54 is continued. Thus, the analog audio signal which is output from the audio player 25 can be input, the audio signal can be amplified by the built-in speaker amplifier 54, and the sound of the audio signal can be produced from the speakers 18. In addition, in the personal computer 10, since the power supply to only the speaker amplifier 54 is continued in order to enable the audio output function at the time of the non-operative state, power-saving can be achieved.

In the above description, the power supply to the speaker amplifier 54 is controlled by only the audio output mode which is selected by the audio output mode select process. Alternatively, the power supply to the speaker amplifier 54 may be controlled according to whether the plug for connection of the cable 26 is attached to the line-in terminal 19.

FIG. 6 shows the control of the power supply to the speaker amplifier 54 according to the combination between the audio output mode and the insertion of the plug in the line-in terminal 19.

Specifically, even in the case where the audio output mode is set to be "permitted", if the jack for connection of the audio player 25 (cable 26) is not inserted in the line-in terminal 19, the power supply to the speaker amplifier 54 is turned off. Thus, in the state in which the audio output function is not used, the power supply to the speaker amplifier 54 is turned off, and further power-saving is achieved.

In the case where the EC/KBC 45 is informed by the status signal S1 from the switch 52 that the jack is connected to the line-in terminal 19, the power supply to the speaker amplifier 54 is turned on at the time of the non-operative state, as described above. In the case where the EC/KBC 45 is informed by the status signal S1 from the switch 52 that the jack is not connected to the line-in terminal 19, the power supply to the speaker amplifier 54 is turned off. In the case where the audio output mode is "permitted", it should suffice if the EC/KBC 45 supplies power to the speaker amplifier 54 from the time point at which the jack is connected to the line-in terminal 19.

In the above description, in the case where the audio output function is enabled (audio output mode "permitted"), the power supply (A power) to the speaker amplifier 54 and analog switch 53 is turned on at the time of the non-operative state. However, for example, in a case where a manual switch, which is operated by the user, is used for the analog switch 53, it should suffice if power is supplied to only the speaker amplifier 54.

If the power consumption at the time of standby is low or if there is no need to reduce power consumption, it is possible to supply power to the speaker amplifier 54 at all times when the personal computer is in the non-operative state.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
    a terminal configured to receive an audio signal from an external device;
    an amplifier configured to amplify the audio signal;
    a speaker configured to output sound corresponding to the audio signal which is amplified by the amplifier;
    a power supply circuit configured to supply power to the amplifier;
    a processor configured to select either enabling or disabling of a first mode, and to store data indicative of whether the first mode is enabled or disabled, the first mode being a mode in which audio output is permitted when the electronic apparatus is in a non-operative state, wherein the selection is performed in accordance with a user operation, and wherein the user operation is performed when the electronic apparatus is in an operative state;
    a switching circuit configured to switch between a first path which connects the terminal and the amplifier and a second path which connects the terminal and the amplifier via a second controller configured to operate when the electronic apparatus is in the operative state; and
    a first controller configured to determine whether the data indicative of the enabling of the first mode is stored, when the electronic apparatus is instructed to power off the apparatus,
    wherein the first controller is configured to control the power supply circuit to continue supplying power to the amplifier during the non-operative state of the electronic apparatus, and to switch the switching circuit to the first path, if the data indicative of the enabling of the first mode is stored.

2. The electronic apparatus of claim 1, wherein the first controller is configured to control the power supply circuit to continue supplying power to the amplifier during the non-operative state of the electronic apparatus, if the data indicative of the enabling of the first mode is stored and an external device is coupled to the terminal.

3. The electronic apparatus of claim 1, further comprising a volume configured to adjust amplification of the audio signal by the amplifier.

4. The electronic apparatus of claim 2, further comprising a detector configured to detect that an audio signal is input to the terminal from the external device,
    wherein the first controller is configured to control the power supply circuit to continue supplying power to the amplifier during the non-operative state of the electronic apparatus, if the data indicative of the enabling of the first mode is stored and the detector detects that the audio signal is input.

5. An audio signal processing method of an electronic apparatus, the electronic apparatus comprising a terminal configured to receive an audio signal from an external device, and a power supply circuit configured to supply power to the amplifier, the method comprising:
    selecting either enabling or disabling of a first mode, the first mode being a mode in which audio output is permitted when the electronic apparatus is in a non-operative state, wherein the selecting is performed in accordance with a user operation, and wherein the user operation is performed when the electronic apparatus is in an operative state;
    storing data indicative of whether the first mode is enabled or disabled; and
    determining whether the data indicative of the enabling of the first mode is stored, when the electronic apparatus is instructed to power off the apparatus and controlling the power supply circuit to continue supplying power to the amplifier during the non-operative state of the electronic apparatus and switching a path from a path which connects the terminal and the amplifier via a controller configured to operate when the electronic apparatus is in the operative state to another path which connects the terminal and the amplifier, if the data indicative of the enabling of the first mode is stored.

6. The method of claim 5, wherein the controlling controls the power supply circuit to continue supplying power to the amplifier during the non-operative state of the electronic apparatus, if the data indicative of the enabling of the first mode is stored and an external device is coupled to the terminal.

7. The method of claim 6, further comprising detecting that an audio signal is input to the terminal from the external device,
    wherein the controlling controls the power supply circuit to continue supplying power to the amplifier during the non-operative state of the electronic apparatus, if the data indicative of the enabling of the first mode is stored and it is detected that the audio signal is input.

* * * * *